United States Patent [19]

Kusumi

[11] 4,152,668
[45] May 1, 1979

[54] PROTECTION CIRCUIT FOR AMPLIFIER CIRCUITS

[75] Inventor: Jiro Kusumi, Yokohama, Japan

[73] Assignee: Tokyo Shibaura Electric Co., Ltd., Japan

[21] Appl. No.: 881,068

[22] Filed: Feb. 24, 1978

[30] Foreign Application Priority Data

Feb. 24, 1977 [JP] Japan .............................. 52-20742[U]

[51] Int. Cl.² .......................................... H03F 1/30
[52] U.S. Cl. .................................................. 330/298
[58] Field of Search ..................... 330/207 P, 289, 298

[56] References Cited

U.S. PATENT DOCUMENTS

| | | | |
|---|---|---|---|
| 3,755,751 | 8/1973 | Ring | 330/207 P X |
| 3,967,207 | 6/1976 | Wheatley | 330/298 X |
| 4,021,701 | 5/1977 | Davies | 330/207 P X |

*Primary Examiner*—James B. Mullins
*Attorney, Agent, or Firm*—Finnegan, Henderson, Farabow & Garrett

[57] ABSTRACT

A protection circuit for amplifier circuits comprises first and second power source terminals, a first resistor connected at one end to the first power source terminal, a first Zener diode circuit including a plurality of first Zener diodes and connected between the first resistor and the second power source terminal, a second Zener diode connected between the first and second power source terminals, a series circuit including second and third resistors and connected across the second Zener diode, a transistor which is connected at the base to a junction between the second and third resistors and at the collector to the other terminal of the first resistor, and a second Zener diode circuit including a plurality of third Zener diodes and connected between the emitter of the transistor and the second power source terminal. The other end of the first resistor is connected through a signal interruption circuit to a power amplifier section. When voltage between first and second power source terminals or an operation temperature rises to exceed a predetermined value, the voltage drop produced across the first resistor energizes the signal interruption circuit to interrupt an input signal flow to the power amplifier section.

13 Claims, 4 Drawing Figures

PROTECTION CIRCUIT FOR AMPLIFIER CIRCUITS

BACKGROUND OF THE INVENTION

The present invention relates to a protection circuit for amplifier circuits for protecting the circuit components of an amplifier circuit from deterioration or destruction when power source voltage for the amplifier circuit or the operation temperature thereof rises to exceed a predetermined value.

In amplifier circuits used in audio apparatus, particularly power amplifier circuits, rise in the power source voltage for the amplifier circuits and rise in the operation temperature thereof due to heat generation of the circuit components per se possibly give rise to deterioration or destruction of the circuit components of the amplifier circuits, particularly those circuit components arranged at the output stage thereof. In this field, it is common practice to employ separate protection circuits to protect the circuit components from deterioration or destruction due to the power source voltage rise and the operation temperature rise, respectively. Such a scheme, however, needs larger number of circuit components for the protection circuit construction, thus resulting in expensive protection circuits.

SUMMARY OF THE INVENTION

Accordingly, an object of the present invention is to provide a protection circuit for amplifier circuits for preventing the amplifier circuits from deterioration or destruction of the circuit components when the power source voltage or the operation temperature thereof rises to exceed a predetermined value. To this end, the protection circuit uses a by-pass circuit or signal interruption circuit driven in such a situation.

According to one aspect of the present invention, there is provided a protection circuit for amplifier circuits comprising first and second power source terminals; a power source voltage detection circuit which is connected between the first and second power source terminals and produces an output signal when voltage between the first and second power source terminals reaches a predetermined value; an operation temperature detection circuit for producing an output signal when the operation temperature exceeds a predetermined value; and a signal interruption circuit which is connected at the output terminal to the input terminal of an amplifier circuit to be protected and which interrupts an input signal flow to the amplifier circuit, in response to the output signal from the power source voltage detection circuit or the operation temperature circuit.

Additional objects and advantages of the invention will be apparent from the following description in connection with the accompanying drawings, in which:

DETAILED DESCRIPTION OF THE PREFERRED EMBODIMENT

Figure 1:
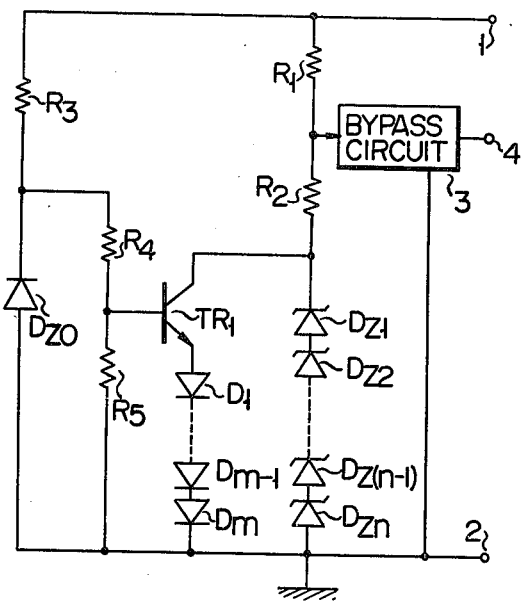
FIG. 1 shows a circuit diagram of an embodiment of a protection circuit for amplifier circuits according to the invention.

Reference is made to FIG. 1 illustrating an embodiment of a protection circuit for an amplifier circuit according to the present invention.

As shown, a series circuit including resistors $R_1$ and $R_2$ and n Zener diodes $D_{z1}$ to $D_{zn}$ is inserted between a power source terminal 1 and a ground terminal 2. Another series circuit including a resistor $R_3$ and a Zener diode $D_{z0}$ is inserted between the terminals 1 and 2. Resistors $R_4$ and $R_5$ are connected in series between the ground terminal 2 and a junction between the resistor $R_3$ and the Zener diode $D_{z0}$. A junction between the resistors $R_4$ and $R_5$ is connected to the base of an NPN transistor $TR_1$. The transistor $TR_1$ is connected at the collector to a junction between the resistor $R_2$ and the Zener diode $D_{z1}$, and at the emitter to the ground terminal 2, through m diodes $D_1$ to $D_m$.

Connected to a junction between the resistors $R_1$ and $R_2$ is a by-pass circuit, or a signal interruption circuit 3. The output terminal 4 of the signal interruption circuit 3 is coupled with the signal input terminal of an amplifier output stage 5, for example. As will be described later, when the potential difference across resistors $R_1$ and $R_2$ reaches a predetermined level, the signal interruption circuit 3 is energized to couple its output terminal 4 to ground, for example. Accordingly, in such a case, the signal to be applied to the signal input terminal of the amplifier circuit is by-passed by way of the signal interruption circuit 3 to ground, thereby to interrupt the signal flow to the amplifier circuit.

The operation of the protection circuit is now explained with reference to FIG. 1.

It is assumed that the Zener voltages of the Zener diodes $D_{z1}$ to $D_{zn}$ are so selected that the total Zener voltage $nV_{z1}$ is equal to a power source voltage $V_{cc}$ supplied to the amplifier circuit. When some reason causes the power source voltage $V_{cc}$ to exceed a predetermined value, current flows through resistors $R_1$ and $R_2$ and the Zener diodes $D_{z1}$ to $D_{zn}$. This increases the voltage at the junction between the resistors $R_1$ and $R_2$, and energization of the signal interruption circuit 3. As a result, the output terminal 4, that is, the signal input terminal at the output stage 5 in the amplifier circuit, is grounded. Accordingly, the input signal to be applied to the signal input terminal of the output stage is by-passed through the signal interruption circuit 3 so that little input signal is applied to the output stage and thus the circuit elements in the output stage are quiescent. In this manner, these circuit elements are protected from deterioration or destruction occurring at an abnormal rise in the power source voltage.

Description will now be given about a case where the temperature of the circuit elements of the amplifier circuit, that is, the operation temperature, rises.

Designations for necessary factors will first be given as follows: $V_{z0}$ for the Zener voltage of the Zener diode $D_{z0}$; $V_F$ for the forward voltages of m diodes $D_1$ to $D_m$ and the voltage between the base and emitter of the transistor $TR_1$; $\Delta V_{z0}$ for the change rate of the Zener voltage $V_{z0}$ of the Zener diode $D_{z0}$ with respect to temperature change, i.e. the temperature coefficient; $\Delta V_F$ for change in the voltage $V_F$ of each of the diodes $D_1$ to $D_m$ or voltage $V_F$ between the emitter and base of the transistor $TR_1$ with respect to temperature change, i.e. the temperature coefficient. Assume now that the operation temperature of the amplifier circuit rises from the normal temperature $T_a$ to a higher temperature $T_b$ and that, at this time, the temperature of the Zener diode $D_{z0}$, the transistor $TR_1$, the diodes $D_1$ to $D_m$ also rise up to the temperature $T_b$. Under this condition, the Zener voltage $V_{zb}$ of the Zener diode $D_{z0}$ at the temperature $T_b$ is expressed by the following equation:

$$V_{zb} = V_{z0} + (T_b - T_a)\Delta V_{z0}$$

The minimum base voltage $V_{BM}$ to permit the conduction of the transistor $TR_1$ at the temperature $T_b$, is given:

$$V_{BM} = V_F(n+1) - \Delta V_F(n+1)(T_b - T_a) \qquad (1)$$
$$= (n+1)\{V_f - \Delta V_F(T_b\, T_a)\}$$

In order to render the transistor $TR_1$ conductive when the temperature at the PN junctions of the diodes $D_1$ to $D_m$ and the transistor $TR_1$ is $T_b$, the resistors $R_4$ and $R_5$ are so selected that the voltage drop $V_{d5}$ across the resistor $R_5$ is equal to the minimum base voltage $V_{BM}$. This is expressed by the following equation:

$$V_{D5} = V_{BM} = \{V_{z0} + (T_b - T_a)\Delta V_{z0}\}\frac{R_5}{R_4 + R_5} \qquad (2)$$
$$= (n+1)\{V_F - \Delta V_F(T_b - T_a)\}$$

In this manner, when the transistor $TR_1$ is turned on at the temperature $T_b$, a current path is completed including the resistors $R_1$ and $R_2$, the collector-emitter path of the transistor $TR_1$ and the diodes $D_1$ to $D_m$ so that current flows through the current path between the power source terminal 1 and the ground terminal 2. The current flow produces a voltage drop across the resistor $R_2$ which in turn energizes the signal interruption circuit 3 to couple the output terminal 4 with the ground terminal 2. As a result, the signal to be applied to the signal input terminal of the output stage of the amplifier circuit is by-passed through the signal interruption circuit to interrupt the supply thereof to the amplifier output stage.

Figure 2:
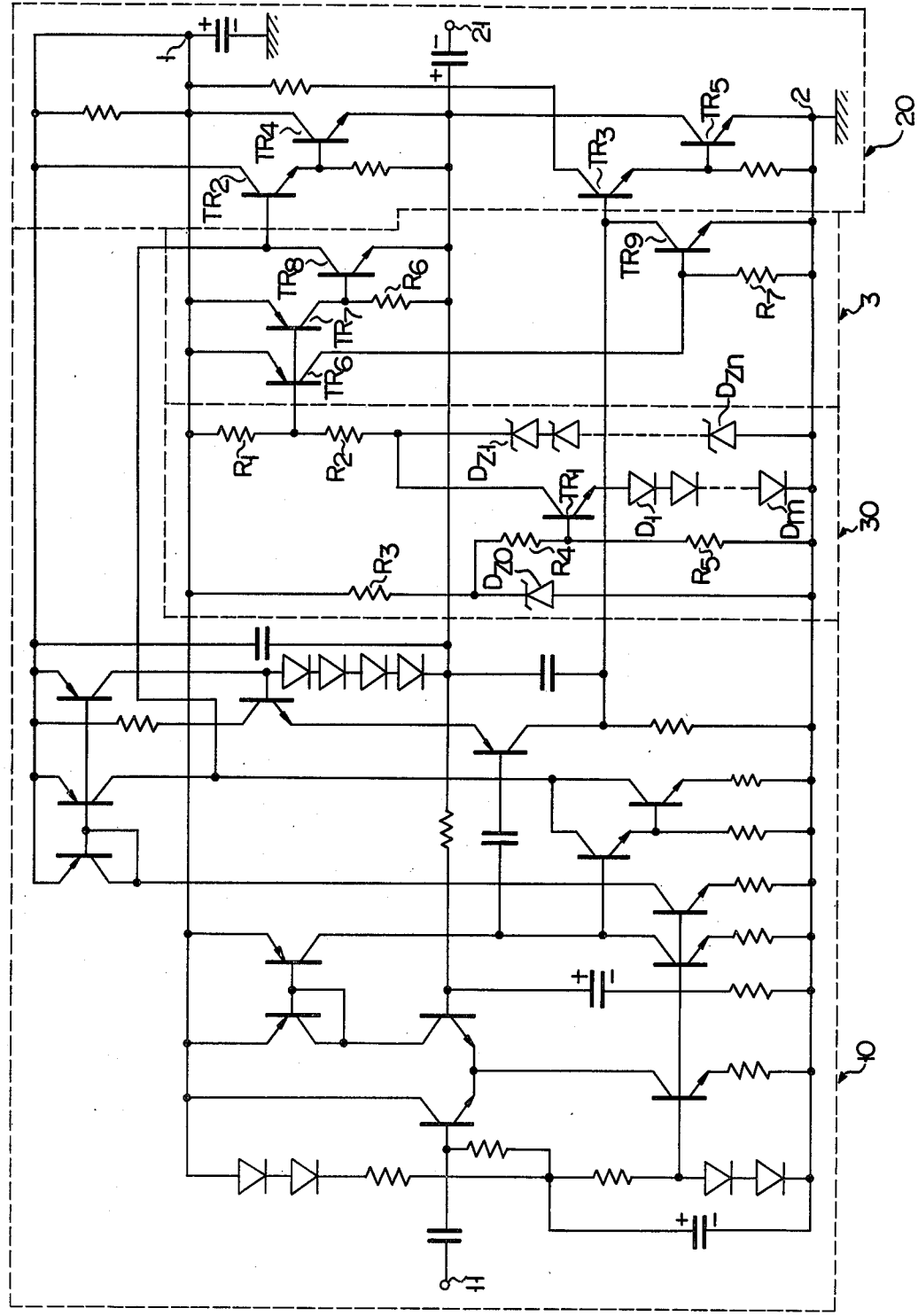
FIG. 2 shows a circuit diagram of an amplifier circuit into which the protective circuit shown in FIG. 1 is incorporated.

Turning now to FIG. 2, there is shown a power amplifier circuit of SEPP (single ended push-pull) with the protection circuit shown in FIG. 1. In the figure, a preamplifier section 10 is provided with a well known differential amplifier and an AC power source and amplifies an input signal applied to its input terminal 11 up to a given level. The signal amplified in the preamplifier section 10 is supplied to a power amplifier section 20. The positive component of the signal is applied to the base of the NPN transistor $TR_2$ in the section 20 while the negative component thereof to the NPN transistor $TR_3$. The emitters of these transistors $TR_2$ and $TR_3$ are connected to the bases of NPN type output transistors $TR_4$ and $TR_5$, respectively. The emitter of the transistor $TR_4$ is connected to the collector of the transistor $TR_5$ and to an output terminal 21 through which an amplified output signal is delivered.

As shown in FIG. 1, the protection circuit 30 is connected between a positive power source terminal 1 and a ground terminal 2. The signal interruption circuit 3 is provided with PNP transistors $TR_6$ and $TR_7$ of which the emitters are connected to a positive power source terminal 1 and the bases are connected to a junction between resistors $R_1$ and $R_2$. The collector of the transistor $TR_7$ is coupled with the emitter of the transistor $TR_4$ through the resistor $R_6$ and directly to the base of an NPN transistor $TR_8$. The emitter of the transistor $TR_8$ is coupled with the emitter of the output transistor $TR_4$ and the collector thereof is connected to the base of the transistor $TR_2$ of the power amplifier section 20. As will be recalled, the base of the transistor $TR_2$ receives the positive component of the signal fed from the preamplifier section 10. The collector of the transistor $TR_6$ is connected to the ground terminal 2 by way of the resistor $R_7$ and directly to the base of an NPN transistor $TR_9$. The emitter of the transistor $TR_9$ is connected to the ground terminal 2 and the collector thereof is coupled to the base of the transistor $TR_3$ for receiving the negative component of the signal.

In the above-mentioned amplifier circuit, when the power source voltage rises or the operation temperature rises, current flows through the resistors $R_1$ and $R_2$, thereby to render the transistors $TR_6$ and $TR_7$ conductive and then the transistors $TR_8$ and $TR_9$ conductive, too. As a result, the positive component of the signal outputted from the preamplifier section 10 is by-passed to the output terminal 21 through the transistor $TR_8$ in conductive state while the negative component thereof is by-passed to the ground terminal 2 through the transistor $TR_9$ in conductive state. Therefore, little signal is supplied to the bases of the transistors $TR_2$ and $TR_3$ of the power amplifier section 20 so that these transistors $TR_2$ and $TR_3$ are inoperative. In this manner, when the power source voltage or the operation temperature rises in the SEPP push-pull amplifier circuit, the power transistors $TR_4$ and $TR_5$ are protected from deterioration or destruction.

Figure 3:
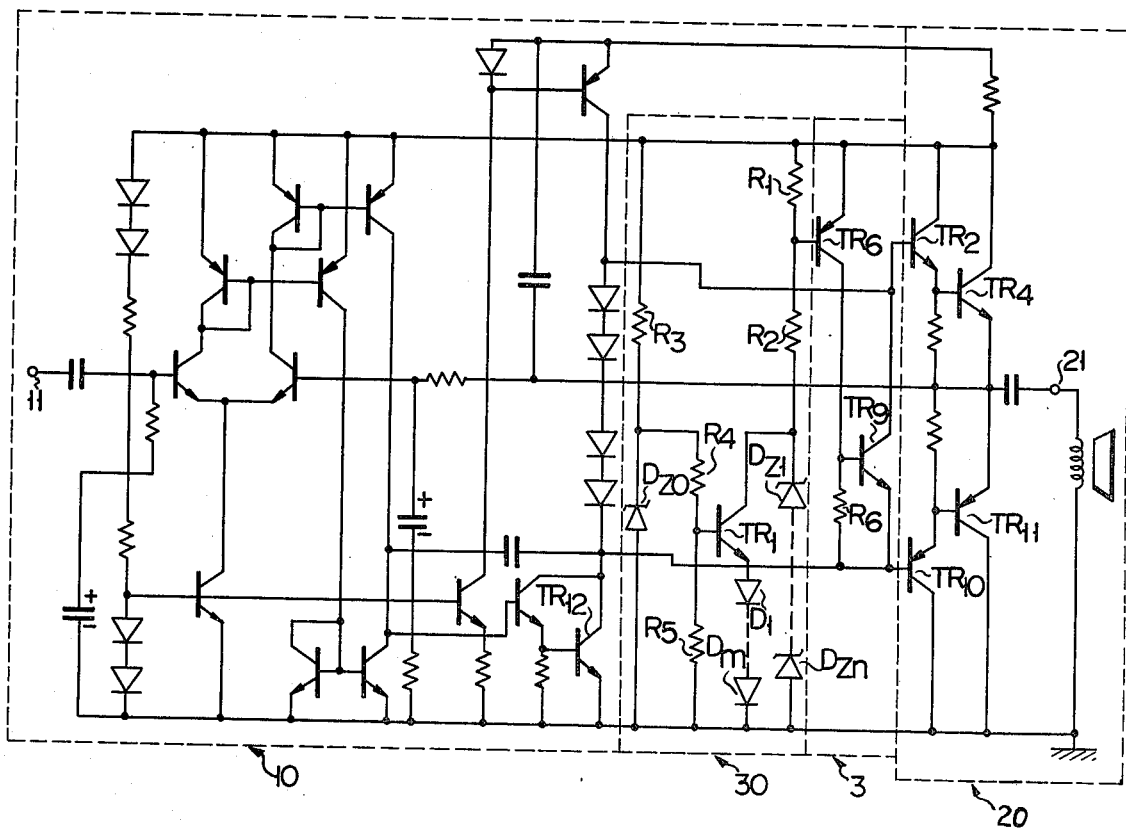
FIG. 3 shows a circuit diagram of another amplifier circuit with a protective circuit of the invention which is another embodiment.

FIG. 3 shows a power amplifier circuit into which a protection circuit according to the present invention is incorporated. The power amplifier circuit is similar to that shown in FIG. 2, except that the negative signal component of the power amplifier section 20 is applied to the PNP transistors $TR_{10}$ and not to the NPN transistors $TR_2$ and $TR_5$ and that the signal interruption circuit 3 is comprised of transistors $TR_6$ and $TR_9$. The rise of the power source voltage or the operation temperature causes current with a predetermined value to flow through the resistors $R_1$ and $R_2$ and thus to render the transistors $TR_6$ and $TR_9$ conductive. As a result, the positive and negative signal input terminals of the power amplifier section 20 are electrically connected with each other, that is, the bases of the transistors $TR_2$ and $TR_{10}$ are directly coupled with each other, and therefore the signal flow from the preamplifier section 10 to the power amplifier section 20 is shut off.

Figure 4:
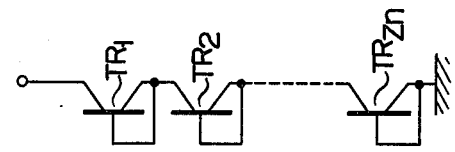
FIG. 4 shows a transistor circuit usable in place of the Zener diode for constant voltage used in FIG. 3.

While the invention has been particularly shown and described with reference to preferred embodiments thereof, it will be understood by those skilled in the art that the foregoing and other changes in form and details can be made therein without departing from the spirit and scope of the invention. For example, n Zener diodes $D_{z1}$ to $D_{zn}$ used in the protection circuit 30 shown in FIGS. 2 and 3 may be substituted by n transistors $TR_{z1}$ to $TR_{zn}$ arranged in diode connection shown in FIG. 4.

What is claimed is:

1. A protection circuit for push pull amplifier circuits formed of a pair of amplifier sections comprising:
    power source terminal and reference potential terminal;
    a power source voltage detection circuit which is connected between said power source and reference potential terminals and produces an output signal when voltage between said power source and reference potential terminals reaches a first predetermined voltage value;

an operation temperature detection circuit connected between said power source and reference potential terminals for producing an output signal when the operation temperature exceeds a predetermined temperature value; and, a signal interruption circuit which is connected at the output terminals to the respective input terminals of said pair of amplifier sections of the amplifier circuit to be protected and which interrupts input signal flow into said pair of amplifier sections of the amplifier circuit, in response to at least one of the output signals from said power source voltage detection circuit and said operation temperature detection circuit.

2. A protection circuit according to claim 1, wherein said power source voltage detection circuit includes resistive means coupled at one end with said power source terminal and a current path which is energized when the voltage between said power source and reference potential terminals reaches said first predetermined voltage value to permit current to flow through the current path and said resistive means.

3. A protection circuit according to claim 2, wherein said current path includes a Zener diode circuit having at least one Zener diode and connected between the other end of said resistive means and said reference potential terminal.

4. A protection circuit according to claim 2, wherein said current path has a plurality of transistors diode-connected between the other end of said resistive means and said reference potential terminal.

5. A protection circuit according to claim 2, wherein said resistive means includes a first resistor connected at one end to said power source terminal and at the other end to said signal interruption circuit and a second resistor connected at one end to said signal interruption circuit.

6. A protection circuit according to claim 1, wherein said operation temperature detection circuit includes first resistive means connected at one end to said power source terminal and a current path which is energized when the operation temperature reaches said predetermined temperature value to permit current to flow therethrough via said first resistive means.

7. A protection circuit according to claim 6, wherein said current path includes a series circuit having second resistive means and a Zener diode interposed between said power source and reference potential terminals, a voltage dividing circuit connected between said reference potential terminal and a junction between said second resistive means and said Zener diode, and a transistor which is connected at the base to the output terminal of said voltage dividing circuit, at the collector to the other terminal of said first resistive means and at the emitter to said reference potential terminal.

8. A protection circuit according to claim 7, wherein said transistor is connected at the emitter to said reference potential terminal through a diode circuit including at least one diode.

9. A protection circuit according to claim 6, wherein said resistive means includes a first resistor connected at one end to said power source terminal and at the other end to said signal interruption circuit and a second resistor connected at one end to said signal interruption circuit.

10. A protection circuit according to claim 1, wherein said power source voltage detection circuit includes a first resistive means connected at one end to said power source terminal and a first current path which is energized when the voltage between said power source and reference potential terminals reaches said first predetermined voltage value, thereby to permit current to flow therethrough via said first resistive means, and said operation temperature detection circuit includes a second current path which is connected to said first resistive means and permits current to flow therethrough via said first resistive means, when the operation temperature reaches said predetermined temperature value.

11. A protection circuit according to claim 10, wherein said first current path which is connected between the other end of said first resistive means and said reference potential terminal and includes at least one Zener diode, and said second current path includes a series circuit having second resistive means and a Zener diode interposed between said power source and reference potential terminals, a voltage dividing circuit connected between said reference potential terminal and a junction between said second resistive means and said Zener diode, and a transistor which is connected at the base to the output terminal of said voltage dividing circuit, at the collector to the other terminal of said first resistive means and at the emitter to said reference potential terminal.

12. A protection circuit according to claim 1, wherein said signal interruption circuit includes first and second transistors which are connected at the bases to the output terminals of said power source voltage detection circuit and the operation temperature detection circuit and at the emitters to said power source terminal, a third transistor which is connected at the base to the collector of said first transistor, at the emitter to said reference potential terminal, and at the collector to a first input terminal of said amplifier circuit, and a fourth transistor which is connected at the base to the collector of said second transistor, and the collector to a second input terminal of said amplifier circuit.

13. A protection circuit according to claim 1, wherein said signal interruption circuit includes a first transistor which is connected at the base to said power source voltage detection circuit and said operation temperature detection circuit, and at the emitter to said power source terminal and a second transistor which has a base connected to the collector of said first transistor and an emitter and collector connected to first and second input terminals of said amplifier circuit, respectively.

* * * * *